United States Patent
Emoto et al.

(10) Patent No.: US 9,158,211 B2
(45) Date of Patent: Oct. 13, 2015

(54) EXPOSURE APPARATUS AND METHOD OF MANUFACTURING DEVICE

(75) Inventors: Keiji Emoto, Saitama (JP); Tomohiro Harayama, Utsunomiya (JP)

(73) Assignee: CANON KABUSHIKI KAISHA (JP)

( * ) Notice: Subject to any disclaimer, the term of this patent is extended or adjusted under 35 U.S.C. 154(b) by 958 days.

(21) Appl. No.: 13/338,388

(22) Filed: Dec. 28, 2011

(65) Prior Publication Data

US 2012/0170008 A1   Jul. 5, 2012

(30) Foreign Application Priority Data

Jan. 1, 2011   (JP) ................................. 2011-000005

(51) Int. Cl.
   *G03F 7/20*   (2006.01)
(52) U.S. Cl.
   CPC .................................. *G03F 7/70725* (2013.01)
(58) Field of Classification Search
   CPC ............ G03F 7/70725; G03F 7/70716; G03F 7/70358; G03F 7/70775; G03F 7/70758; G05B 2219/45028
   USPC .................... 355/53, 73, 75, 77; 700/212, 280
   See application file for complete search history.

(56) References Cited

U.S. PATENT DOCUMENTS

| 5,184,055 | A * | 2/1993 | Ohishi et al. ................... 318/615 |
| 5,995,203 | A * | 11/1999 | Ueda ................................ 355/67 |
| 6,744,511 | B1 * | 6/2004 | Saiki et al. ..................... 356/399 |
| 6,788,391 | B2 | 9/2004 | Iwanaga |
| 2006/0170382 | A1 * | 8/2006 | Yang et al. ..................... 318/114 |
| 2007/0182947 | A1 * | 8/2007 | Hempenius et al. ............ 355/75 |
| 2008/0240501 | A1 * | 10/2008 | Van Der Wijst et al. ...... 382/103 |
| 2011/0193510 | A1 * | 8/2011 | Fleming ......................... 318/611 |
| 2012/0127449 | A1 * | 5/2012 | Kamidi et al. .................. 355/72 |
| 2012/0127451 | A1 * | 5/2012 | Butler et al. .................... 355/72 |

FOREIGN PATENT DOCUMENTS

| JP | 2002373839 A | 12/2002 |
| JP | 2003133216 A | 5/2003 |
| JP | 2004260116 A | 9/2004 |

OTHER PUBLICATIONS

Japanese Office Action issued in Japanese counterpart application No. JP2011-000005, issued Nov. 16, 2012.

* cited by examiner

*Primary Examiner* — Steven H Whitesell Gordon (74) *Attorney, Agent, or Firm* — Rossi, Kimms & McDowell LLP (57) ABSTRACT

A scanning exposure apparatus exposes a plurality of shot regions on a substrate to light while scanning an original and the substrate. The apparatus includes: a stage which holds the substrate and moves; and a controller which controls movement of the stage based on a driving profile that defines the movement of the stage. A portion in the driving profile, which defines the movement of the stage during exposure of at least one shot region, is formed by a sine wave having a frequency lower than a resonance frequency in a stage controller.

11 Claims, 8 Drawing Sheets

EXPOSURE APPARATUS AND METHOD OF MANUFACTURING DEVICE

BACKGROUND OF THE INVENTION

1. Field of the Invention

The present invention relates to an exposure apparatus and a method of manufacturing a device using the same.

2. Description of the Related Art

A scanning exposure apparatus which exposes a wafer while scanning a mask and the wafer with respect to an optical system is the current mainstream exposure apparatus for manufacturing a semiconductor device. To improve the resolution, the scanning exposure apparatus must maintain constant the exposure amount (dose) per unit area, at which the wafer is irradiated with light during scanning. To do this, it is of prime importance to appropriately set, for example, the amount of light emitted by a pulsed light source and the interval between light emissions according to the wafer moving velocity.

In the conventional exposure apparatus, a wafer stage has a driving profile formed by a combination of an acceleration interval, settlement interval, constant velocity interval, and deceleration interval. Note that the settlement interval means the interval from completion of stage acceleration until the start of the constant velocity interval, that is, the transition interval until the control error that must be settled to position the stage becomes sufficiently small. A general scanning exposure apparatus performs exposure in the constant velocity interval in which the exposure amount on the wafer can easily be controlled to be constant. This is because in the constant velocity interval, simply maintaining the amount of light from the light source constant makes it possible to maintain the dose constant, thus easily sustaining high dose control accuracy.

The exposure apparatus is required to attain not only a given exposure accuracy and overlay accuracy but also a high productivity. This requirement has conventionally been met by increasing the power of a stage driving unit so that the stage can be driven at a high acceleration and velocity. On the other hand, Japanese Patent Laid-Open No. 2002-373839 proposes an exposure system which performs exposure even in the acceleration interval, settlement interval, and deceleration interval while changing the exposure amount of light from the light source in proportion to the stage velocity, to maintain the dose constant.

Exposure during acceleration/deceleration in the prior art technique poses the following problem. That is, in intervals other than the constant velocity interval, the control error associated with the stage position is relatively large, and the positioning accuracy between the optical system and the stage is relatively low, so the overlay accuracy is relatively low. Also, in the intervals other than the constant velocity interval, the control error associated with the stage velocity is large, so adjustment of the exposure amount with higher accuracy requires controlling the stage in consideration of a stage velocity error. This not only complicates an exposure amount controller but also increases the number of factors which degrade the exposure amount controllability. Furthermore, to perform dose control with high accuracy, it is necessary to change the exposure amount of light from the light source so that it follows a change in stage velocity. However, in the stage acceleration and deceleration intervals, the velocity change rate is relatively high, so the exposure amount controllability degrades.

SUMMARY OF THE INVENTION

The present invention provides a scanning exposure apparatus which suppresses degradation in pattern overlay accuracy and exposure amount uniformity.

The present invention in its one aspect provides a method of manufacturing a device, the method comprising: exposing a substrate to light using a scanning exposure apparatus which exposes a plurality of shot regions on the substrate to light while scanning an original and the substrate; developing the exposed substrate; and processing the developed substrate to manufacture a device, the scanning exposure apparatus including: a stage which holds the substrate and moves; and a controller which controls movement of the stage based on a driving profile that defines the movement of the stage, wherein a portion in the driving profile, which defines the movement of the stage during exposure of at least one shot region, is formed by a sine wave having a frequency lower than a resonance frequency in a stage controller.

Further features of the present invention will become apparent from the following description of exemplary embodiments with reference to the attached drawings.

DESCRIPTION OF THE EMBODIMENTS

First Embodiment

Figure 2:
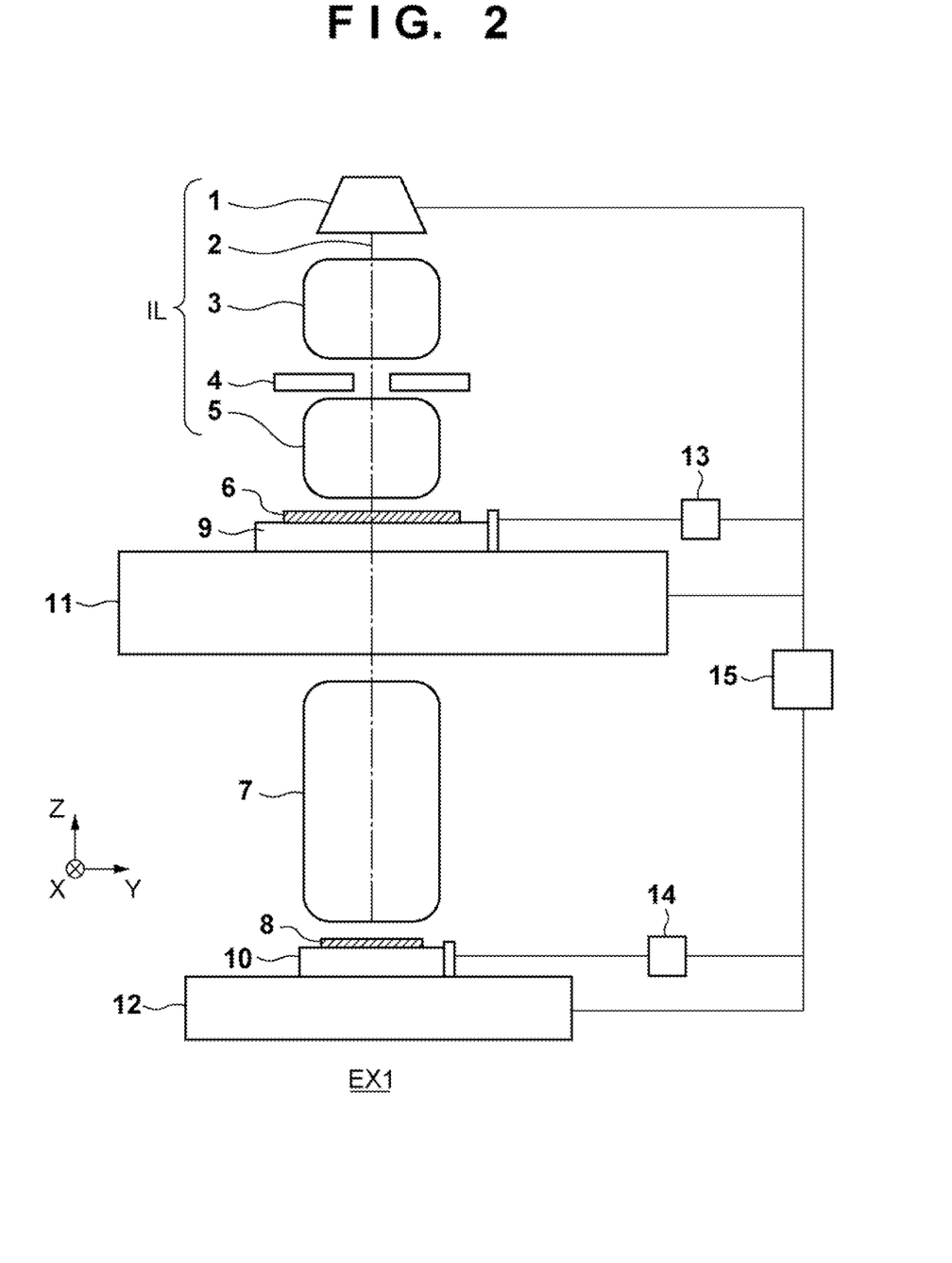
FIG. 2 is a view illustrating an example of the configuration of an exposure apparatus.

FIG. 2 is a view showing the schematic configuration of a scanning exposure apparatus which exposes a plurality of shot regions on a substrate to light while scanning an original and the substrate. A scanning exposure apparatus EX1 includes an illumination system IL, original stage driving unit 11, projection optical system 7, substrate stage driving unit 12, measuring units 13 and 14, and controller 15. The illumination system IL includes, for example, a light source 1 which emits light to expose a substrate 8, a front-side illumination optical system 3, an aperture stop 4, and a rear-side illumination optical system 5. The original stage driving unit 11 drives an original stage 9 which holds an original 6. The projection optical system 7 projects an image of the pattern of the original 6 onto the substrate 8 held by a substrate stage 10. The substrate stage driving unit 12 drives the substrate stage 10 which holds the substrate 8. The measuring unit 13 measures the position, rotation, and tilt of the original stage 9. The measuring unit 14 measures the position, rotation, and tilt of the substrate stage 10. The measuring units 13 and 14 use for example, laser interferometers. The controller 15 controls the light source 1, measuring unit 13, original stage driving unit 11, substrate stage driving unit 12, and measuring unit 14.

A light beam 2 emitted by the light source 1 is incident on and illuminates the original 6 via the front-side illumination optical system 3, aperture stop 4, and rear-side illumination optical system 5. The pattern of the original 6 is projected onto the substrate 8 by the projection optical system 7. The substrate 8 is coated with a resist (photosensitive material), and is exposed to form a latent image on the resist. This latent image is visualized into a physical pattern, that is, a resist pattern upon a development process.

To expose the substrate 8, the original 6 and substrate 8 are synchronously scanned with respect to the projection optical system 7. While measuring the position of the original stage 9 by the measuring unit 13, the original stage 9 is driven using the original stage driving unit 11 based on the measurement result under the control of the controller 15, thereby scanning the original 6. While measuring the position of the substrate stage 10 by the measuring unit 14, the substrate stage 10 is driven using the substrate stage driving unit 12 based on the measurement result under the control of the controller 15, thereby scanning the substrate 8. The controller 15 controls movement of the substrate stage 10 and original stage 9 based on driving profiles which define the movement of the substrate stage 10 and original stage 9 (stages).

Figure 8:
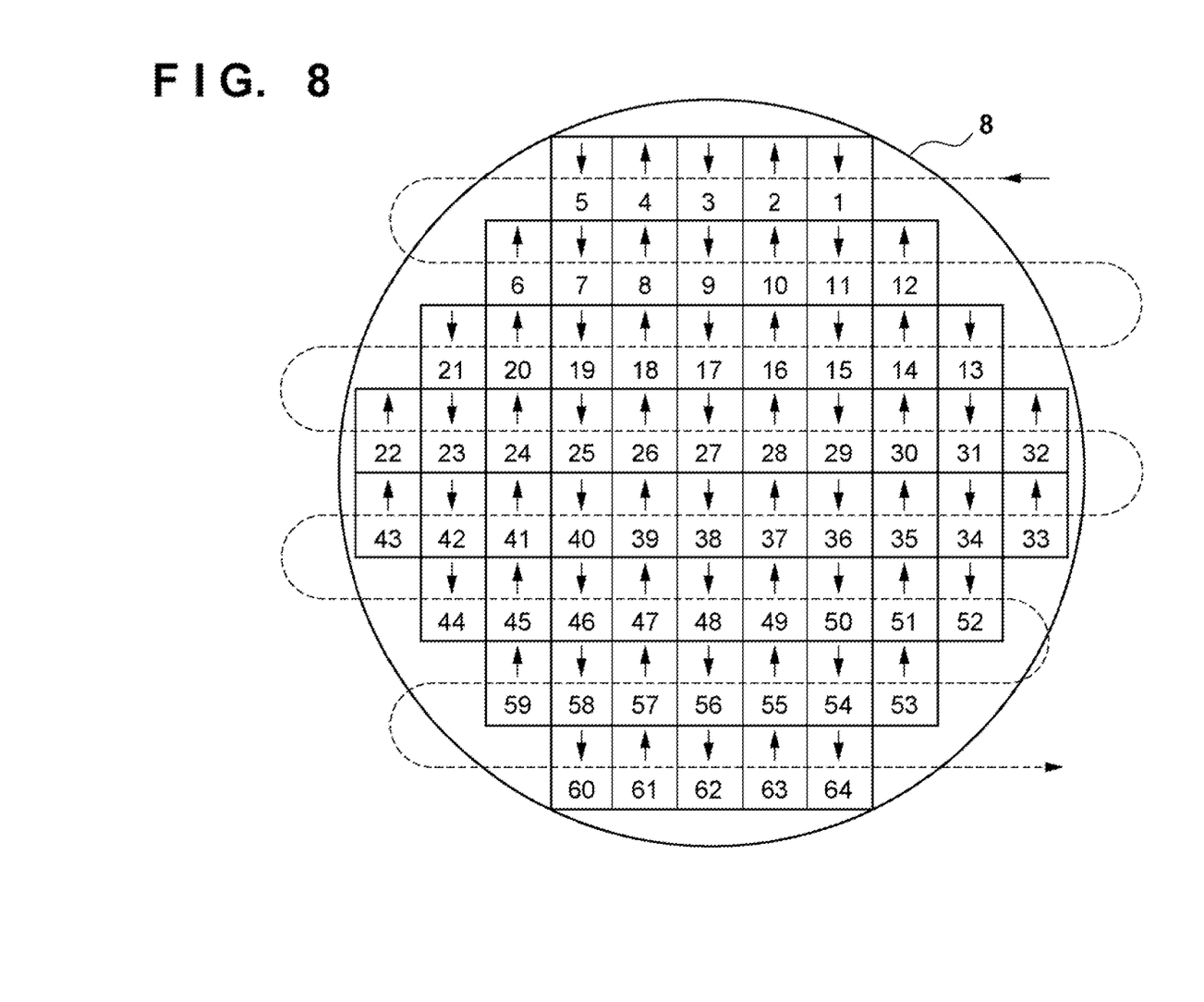
FIG. 8 is a view showing the trace of movement of the substrate stage.

FIG. 8 shows the trace of movement of the substrate stage 10 in terms of movement of the projection optical system 7 relative to the substrate 8. Referring to FIG. 8, 64 shot regions are defined on the substrate 8, and a figure in each shot region indicates the number of this shot region. Also, an arrow in each shot region indicates the direction in which scanning movement of the substrate stage 10 is performed in exposure, and a dotted line schematically indicates the direction in which the substrate stage 10 moves between adjacent shot regions. To move the substrate stage 10, for example, from shot region 1 to shot region 2, a stepping operation is performed to the left in FIG. 8, that is, in a direction perpendicular to the scanning direction in the period from completion of exposure of shot region 1 after a reciprocating scanning operation is performed in the scanning direction until immediately before the start of exposure of shot region 2.

Figure 7:
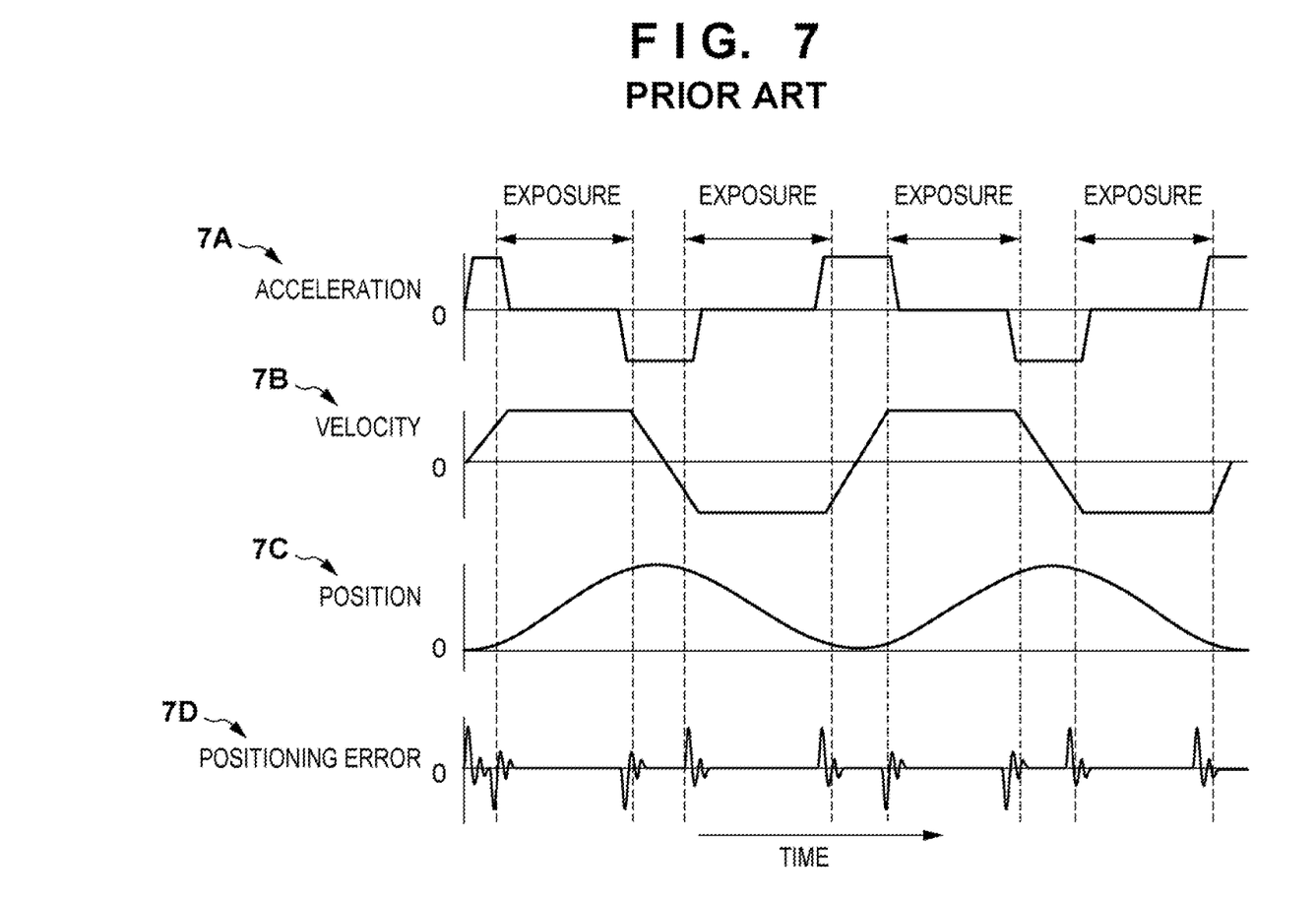
FIG. 7 is a graph showing the relationship between the exposure timing and the driving profile of a substrate stage according to the prior art technique.

FIG. 7 illustrates an example of the driving profile of the substrate stage 10 in the scanning direction, and the exposure timing when exposure is performed during acceleration/deceleration using this driving profile according to the prior art technique. To expose the substrate 8 in a constant velocity interval by the exposure apparatus, the acceleration profile of the substrate stage 10 is close to a trapezoidal profile, as shown in 7A of FIG. 7. Such a driving profile of the substrate stage 10 generates a large positioning error of the substrate stage 10 during acceleration/deceleration, as shown in 7D of FIG. 7. The trapezoidal acceleration profile exhibits a waveform formed by combining a plurality of sine waves having low to high frequencies, and contains sine wave components having frequencies higher than the resonance frequency in a stage controller used for a general exposure apparatus. Therefore, in terms of the control performance of the substrate stage 10, the followability to the driving profile degrades or the control error due to control resonance increases, thus increasing the positioning error of the substrate stage 10 during acceleration/deceleration.

The resonance frequency in position control of a general stage used for an exposure apparatus is about 100 to 500 Hz. Like the acceleration profile used in the conventional exposure apparatus, when a trapezoidal profile, as shown in 7A of FIG. 7, is formed as an acceleration profile, it contains a large number of frequency components of 1 kHz or more. Also, to decrease the number of high-frequency components contained in the acceleration profile, a technique of modifying the transient portions between straight lines in the acceleration profile to a smooth curve is commonly known. Upon modifying the transient portions between straight lines in the acceleration profile into a smooth curve, the number of high-frequency components slightly decreases. However, as long as the acceleration profile exhibits a waveform close to a trapezoidal shape including straight line portions, it still contains a large number of sine waves having low frequencies to high frequencies that exceed the resonance frequency of the substrate stage 10.

Since a general exposure apparatus performs exposure in the constant velocity interval, it poses no serious problem due to factors associated with dose control or a positioning error of the substrate stage 10 during acceleration/deceleration. However, when this exposure apparatus performs exposure while accelerating or decelerating the substrate stage 10, the following three problems are posed.

First, when exposure is performed during acceleration/deceleration using a conventional driving profile having a large positioning error of the stage during acceleration/deceleration, the pattern overlay error is relatively large, as shown in FIG. 7. Therefore, a system which performs exposure during acceleration/deceleration and is capable of reducing the overlay error is desirably provided.

Second, in the stage driving profile of the prior art technique, as shown in FIG. 7, a positioning error of the substrate stage 10 occurs during acceleration/deceleration and during exposure, as described earlier. This means that the stage velocity deviates from an expected velocity profile during acceleration/deceleration of the substrate stage 10 (this deviation will be referred to as a velocity error hereinafter). This reveals that it is insufficient to simply perform exposure amount control based on a velocity profile expected for the substrate stage 10. This makes it necessary to perform exposure amount control in consideration of an actual velocity error with respect to the velocity profile of the substrate stage 10 as well, thus complicating the exposure amount controller. Furthermore, the number of factors which increase the control error increases, and this may degrade the exposure amount control accuracy. Therefore, a system which performs exposure during acceleration/deceleration with a smaller stage velocity error during acceleration/deceleration at least during exposure is desirably provided.

Third, to more accurately form the pattern of the original 6 on the substrate 8, it is necessary to uniform the dose. However, in a system which performs exposure during acceleration/deceleration, the stage velocity changes during exposure, so it is necessary to perform control to change the exposure amount in accordance with the stage velocity. On the other hand, if a control error occurs in exposure amount control, it adversely affects the pattern formation accuracy. In a system which performs exposure during acceleration/deceleration using the conventional stage driving profile, as disclosed in Japanese Patent Laid-Open No. 2002-373839, a control error is more likely to occur in exposure amount control because the stage velocity change rate (stage acceleration) during stage acceleration/deceleration is relatively large. Therefore, to improve the accuracy of pattern formation, a system which performs exposure during acceleration/deceleration and has higher exposure amount control followability is desirably provided.

Figure 1:
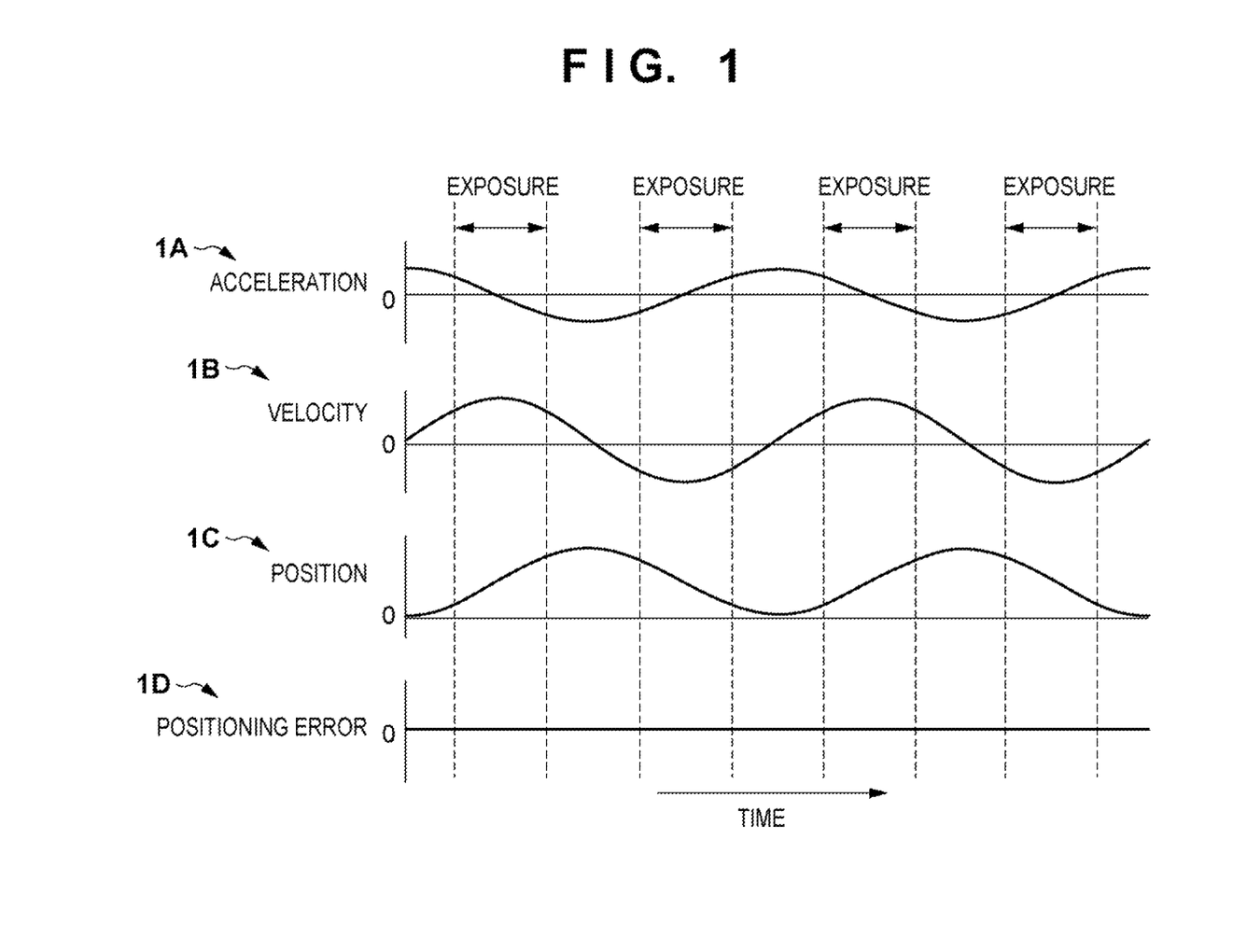
FIG. 1 is a graph showing the relationship between the exposure timing and the driving profile of a substrate stage according to the first embodiment.

To solve the above-mentioned problems, in the first embodiment, a system which performs exposure during acceleration/deceleration using a stage driving profile, as shown in FIG. 1, is created. This system will be described in detail below. FIG. 1 shows the exposure timing and the stage driving profile in the scanning exposure direction in an exposure operation. In the first embodiment, a driving profile is formed by only a single sine wave. Therefore, in the first embodiment, the burden of generating a stage driving profile is little. When, for example, shot regions on the same row are processed at a rate of six shots per sec, stage driving need only be done based on an acceleration driving profile formed by only a 3-Hz sine wave.

Driving profiles associated with the stage velocity and position can be represented by a 3-Hz sine wave as well. The resonance frequency in stage control in the exposure apparatus is about 100 to 500 Hz, which is sufficiently higher than the frequency of a position driving profile having a 3-Hz sine wave. Hence, stage position control can be performed while maintaining the positioning error nearly zero even during acceleration/deceleration. The positioning error shown in 1D of FIG. 1 is kept nearly zero. As shown in 7A and 7B of FIG. 7, the exposure timing is set to the neighborhood in which the acceleration is zero, and that in which the absolute velocity maximizes.

Figure 6:
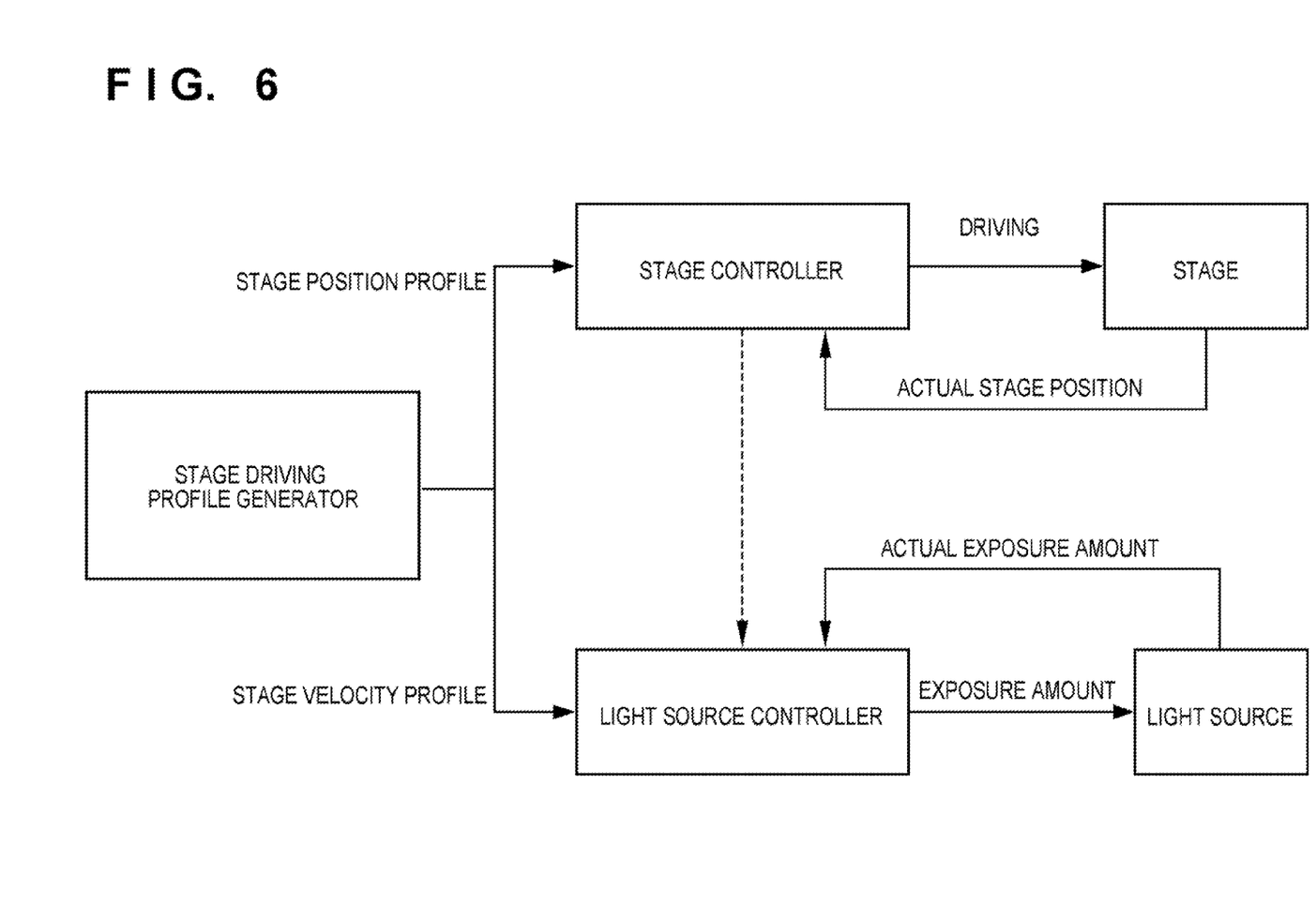
FIG. 6 is a block diagram showing the relationship between units of a controller.

Although the acceleration during exposure shifts more from zero in the exposure apparatus according to the present invention than in that according to the prior art technique, the stage positioning error is kept nearly zero in the former. This allows exposure during acceleration/deceleration while maintaining a given overlay accuracy of the exposure apparatus. Also, since the stage positioning error is kept nearly zero, the stage velocity error is kept nearly zero as well. This obviates the need to take a stage velocity error into consideration in exposure amount control to maintain the dose constant. FIG. 6 shows the relationship between units used in this control. First, a stage driving profile is generated by a driving profile generator of the controller 15. This driving profile is a trapezoidal acceleration/deceleration profile in the prior art technique, whereas it has a sine waveform having frequencies lower than the resonance frequency in stage control in this embodiment. Based on this driving profile, stage position profile information is sent to a stage controller of the controller 15, and stage velocity profile information is sent to a light source controller of the controller 15.

When exposure is performed during acceleration/deceleration using the conventional driving profile, a difference occurs between the stage position profile and the actual stage position during acceleration/deceleration, so it is necessary to transfer stage velocity error information calculated from this difference to the light source controller (a dotted arrow in FIG. 6). The controller 15 then calculates the actual stage velocity from the stage velocity profile and the stage velocity error information to control this stage velocity so that the dose of light with which the substrate is irradiated is maintained constant.

On the other hand, when exposure is performed during acceleration/deceleration using the stage driving profile according to the present invention, the stage positioning error and velocity error are kept nearly zero even during acceleration/deceleration, so there is no need to transfer stage velocity error information to the light source controller. This means that the light source controller can perform light amount control using only the stage velocity profile transferred from the stage driving profile generator. In this manner, the use of the stage driving profile according to this embodiment makes it possible not only to simplify exposure amount control but also to decrease the number of factors which generate a light amount control error, thereby improving the light amount control accuracy. This improves both the dose control accuracy and the pattern transfer accuracy in the exposure apparatus.

Note also that the light source controller controls the light amount. Naturally, the lower the velocity change rate of the stage velocity profile, the better the controllability. In other words, as the maximum frequency which forms the stage driving profile lowers, the controllability improves. In the present invention, the maximum frequency contained in the stage driving profile is limited to generate an exposure amount profile containing only frequencies lower than those in the prior art technique, thus making it possible to improve the controllability of light amount control. From the foregoing description, the above-mentioned three problems can be overcome by adopting an exposure system which performs exposure during acceleration/deceleration using the stage driving profile according to this embodiment.

In the first embodiment, the controller 15 causes the stage driving profile generator to generate a stage acceleration profile. However, the controller 15 can obtain and use, for example, an acceleration profile which is generated by a device provided outside the controller 15 and is stored in a storage unit in advance, instead of generating an acceleration profile by itself. Also, in the first embodiment, the controller 15 controls the position of the substrate stage 10 based on the stage position profile, and controls the substrate stage 10 based on the velocity profile. However, the controller 15 may be configured to control the position of the substrate stage 10 and the light source 1 based on one of the stage position profile, velocity profile, and acceleration profile.

Figure 5:
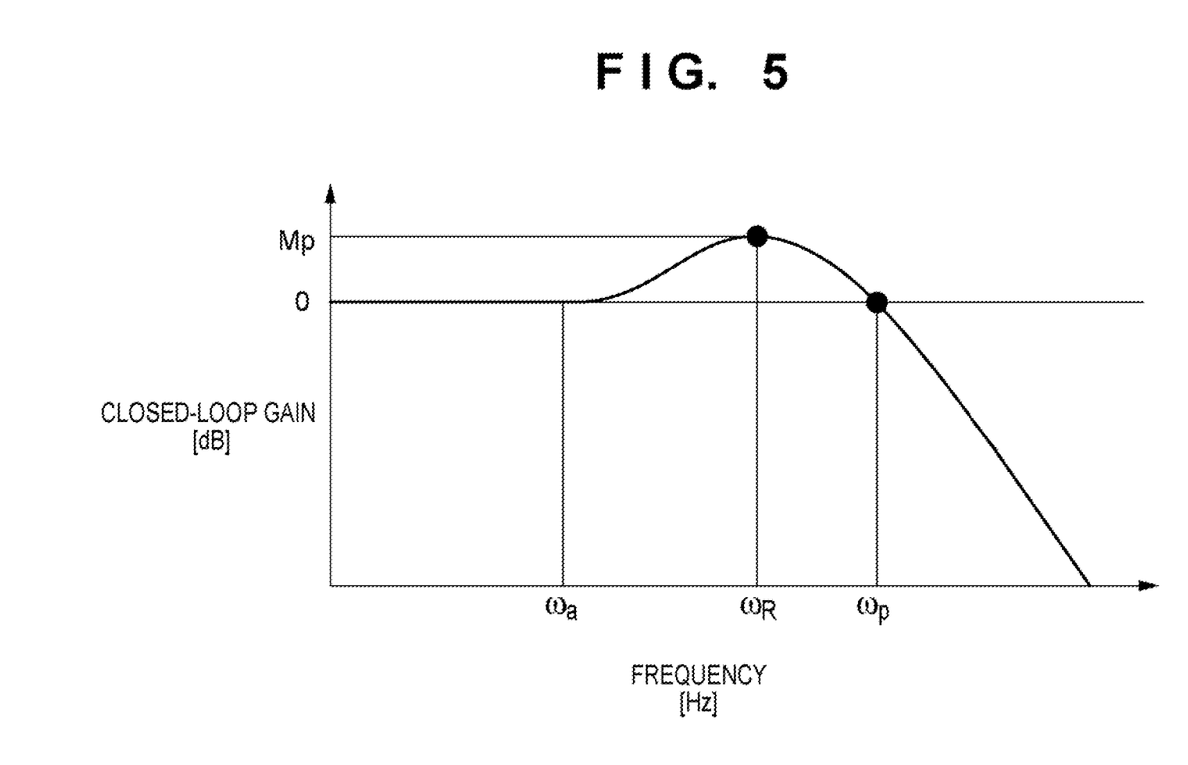
FIG. 5 is a graph showing the definition of the resonance frequency.

The definition of the resonance frequency in stage control will be clarified herein. In the field of control, the resonance frequency is defined in terms of the gain characteristics of a closed-loop transfer function associated with a feedback controller. FIG. 5 is a schematic graph showing the gain characteristics of a closed-loop transfer function associated with stage positioning control, and shows the frequency (Hz) on the abscissa and the closed-loop gain (dB) on the ordinate. A frequency at which the closed-loop gain maximizes is called a resonance frequency $\omega_R$, and a frequency which is higher than the resonance frequency $\omega_R$ and at which the closed-loop gain is 0 dB is called a gain-crossover frequency $\omega_p$.

If a control command waveform containing a frequency around the resonance frequency $\omega_R$ mixes in the gain characteristics, the amplitude of the control command waveform is amplified and then stage positioning is done, so the control error increases. Also, if a control command waveform containing a frequency higher than the gain-crossover frequency in excess of the resonance frequency mixes in the gain characteristics, stage positioning cannot follow it, so the control error increases. To reduce the control error during acceleration/deceleration, a control command waveform containing a frequency lower than at least the resonance frequency $\omega_R$ in stage control is used. In terms of reducing the control error, a driving profile shown in FIG. 5 can be used. The driving profile contains only frequencies which are lower than both the resonance frequency and a frequency $\omega_a$ of a region in which the closed-loop gain is close to 0 dB, as shown in FIG. 5. Thus, the influence of the resonance frequency $\omega_R$ reduces, so the control error, that is, the stage positioning error also reduces. The frequency $\omega_a$ is experimentally known to correspond to a frequency lower than a half of the resonance frequency $\omega_R$ in a stage positioning controller of the exposure apparatus.

From the foregoing description, in a system which performs exposure during acceleration/deceleration, the stage driving profile during exposure can be formed by at least a sine wave having frequencies lower than the resonance frequency in the stage controller. Moreover, a better effect can be obtained when the stage driving profile is formed by a sine wave having frequencies lower than a half of the resonance frequency $\omega_R$ in the stage controller.

The prior art technique assumes a system which performs exposure in the constant velocity interval, and therefore uses a stage driving profile that gives higher priority to reaching a predetermined velocity as early as possible than to reducing a positioning error during acceleration/deceleration. On the other hand, in this embodiment, to allow an exposure operation during acceleration/deceleration while maintaining higher exposure performance, a change is made to a system that gives highest priority to reducing a positioning error during acceleration/deceleration. As a result, this embodiment has a greatest feature in that it adopts a system which drives the stage using a stage driving profile during acceleration/deceleration, that is formed by a sine wave having frequencies equal to or lower than the resonance frequency in stage control.

A driving profile which is suitable for the direction in which shot regions (for example, shot regions 1 to 5) mainly on the same row in the shot layout shown in FIG. 8 are scanned has been described in this embodiment. Stage movement in the direction in which shot regions on the same row are scanned is a reciprocating scanning operation, and is therefore compatible with an acceleration profile formed by a sine wave in this embodiment. In contrast, the stage driving profile in this embodiment is not directly applicable to stage movement (for example, stage movement from shot region 5 to shot region 6 in FIG. 8) to change the shot row. In this case, the driving profiles on respective shot regions must be continuously connected to each other so they do not contain high-frequency components as much as possible.

In this manner, the present invention is not intended to form stage driving profiles in all the intervals of an exposure operation using a sine wave having frequencies equal to or lower than the resonance frequency $\omega_R$ in stage control. In the driving profile, a portion which defines stage movement during exposure of at least one shot region is formed by three or less sine waves having frequencies lower than the resonance frequency $\omega_R$ in the stage controller (for example, by combining them). The portion formed by three or less sine waves having frequencies lower than the resonance frequency $\omega_R$ in the stage controller can be a portion which defines stage movement in at least one reciprocating scanning operation.

Second Embodiment

The first embodiment illustrates an example of a stage driving profile formed by a single sine wave. However, a driving profile may be formed by combining a plurality of sine waves. To relieve the burden of generating a driving profile, the number of sine waves to be combined so as to form the driving profile is determined as three or less. For example, an acceleration profile formed by three sine waves is described by:

$$\text{Acceleration} = A \times \cos(2 \times \pi \times f) + (1/k_1) \times A \times \cos(2 \times \pi \times k_1 \times f) + (1/k_2) \times A \times \cos(2 \times \pi \times k_2 \times f) \quad (1)$$

where A is the amplitude of the stage acceleration, $\pi$ is the ratio of the circumference of a circle to its diameter, f is the fundamental frequency (Hz) of a stage scanning operation, and $k_1$ and $k_2$ are different odd numbers of three or more.

If an acceleration profile is formed by a single sine wave, the second and third terms on the right-hand side of expression (1) are absent, and only the first term (first frequency) is present. If an acceleration profile is formed by two sine waves, the third term on the right-hand side of expression (1) is absent.

Figure 3:
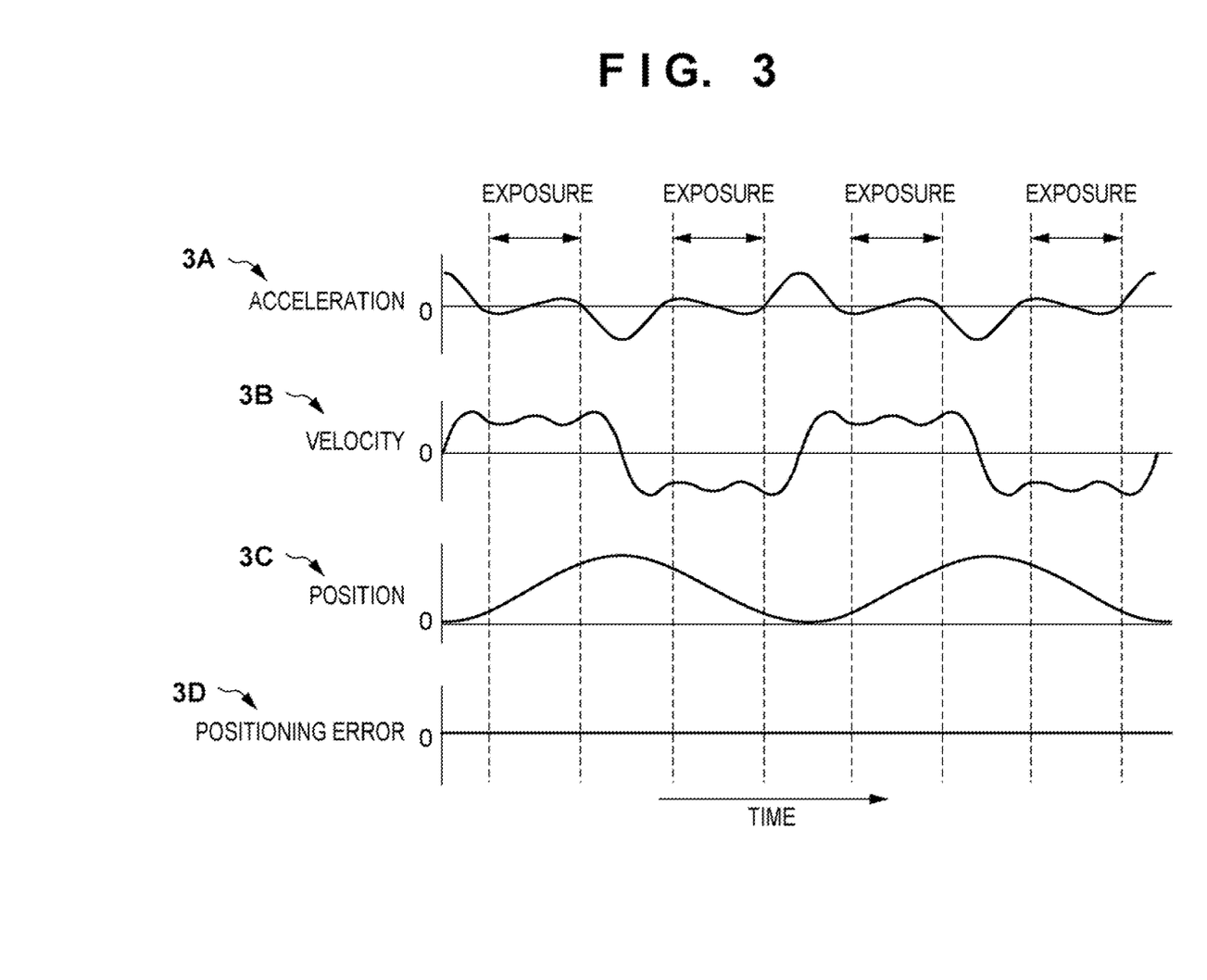
FIG. 3 is a graph showing the relationship between the exposure timing and the driving profile of a substrate stage according to the second embodiment.

In the second embodiment, f=3 Hz is set assuming that shot regions on the same row are processed at a rate of six shots per sec, as in the first embodiment. Also, in the second embodiment, a driving profile is formed by two cosine waves, $k_1$=3 is set for the second term on the right-hand side of expression (1), and the third term on the right-hand side of expression (1) is absent. Although the driving profile is represented by cosine waves in expression (1) so as to match that shown in 3A of FIG. 3, it can naturally be represented by sine waves. FIG. 3 shows the stage driving profile according to the second embodiment. A velocity profile and position profile can be calculated by setting appropriate initial values from the acceleration profile. 3B and 3C in FIG. 3 show a velocity profile and position profile, respectively, upon setting their initial values to zero.

A feature associated with the acceleration profile in expression (1) will be described. The first term of expression (1) is the same as the acceleration profile shown in the first embodiment. A feature of this embodiment lies in the second term of expression (1). The second term is represented by a sine wave (or a cosine wave) having a frequency three times that of the first term and an amplitude one third of that of the first term, and is combined with the first term. Thus, a sine wave having a frequency of 9 Hz is added, but it has a frequency sufficiently lower than the resonance frequency (100 Hz or more) of the stage. Upon adding a sine wave in the second term, the velocity profile during exposure has a velocity change width during exposure, which is smaller in 3B of FIG. 3 than in 1B of FIG. 1. This means that it is necessary to change the exposure amount in accordance with the stage velocity during exposure, but it is possible to decrease the width at which the exposure amount is changed. This makes it possible to reduce the scales of the light source controller and light source device, thus offering advantages in, for example, cost and apparatus size. In this manner, driving the stage using a driving profile containing a combination of a plurality of sine waves is advantageous in keeping the velocity change width during exposure small.

Although an example in which a driving profile is generated using a combination of two sine waves has been shown in this embodiment, three sine waves can also be combined so that the driving profile has frequencies equal to or lower than the resonance frequency in stage control, for the sake of simplification of the exposure amount controller and light source. In this case, a sine wave (or a cosine wave) in the third term for $k_2$=5 on the right-hand side of expression (1) need only be present.

Third Embodiment

From a commonly known Fourier series expression, the waveform change width in a region corresponding to the velocity in the exposure interval is known to decrease by combining a plurality of sine waves, as presented in expression (1). Hence, an example in which an acceleration driving profile is generated using expression (1) has been shown in the first embodiment. However, in generating a driving profile by combining a plurality of sine waves, the present invention is not limited to expression (1). The frequencies and amplitudes of sine waves to be combined may be selected within the limits of the exposure amount controllability and stage controllability, and various other systematic limits. This embodiment shows an example of an acceleration driving profile defined by an expression different from expression (1), as:

$$\text{Acceleration:} A \times \cos(2 \times \pi \times f) + (1/10) \times A \times \cos(2 \times \pi \times 3 \times f) \quad (2)$$

where A is the stage acceleration amplitude, n is the ratio of the circumference of a circle to its diameter, and f is the fundamental frequency (Hz) of a stage scanning operation.

Figure 4:
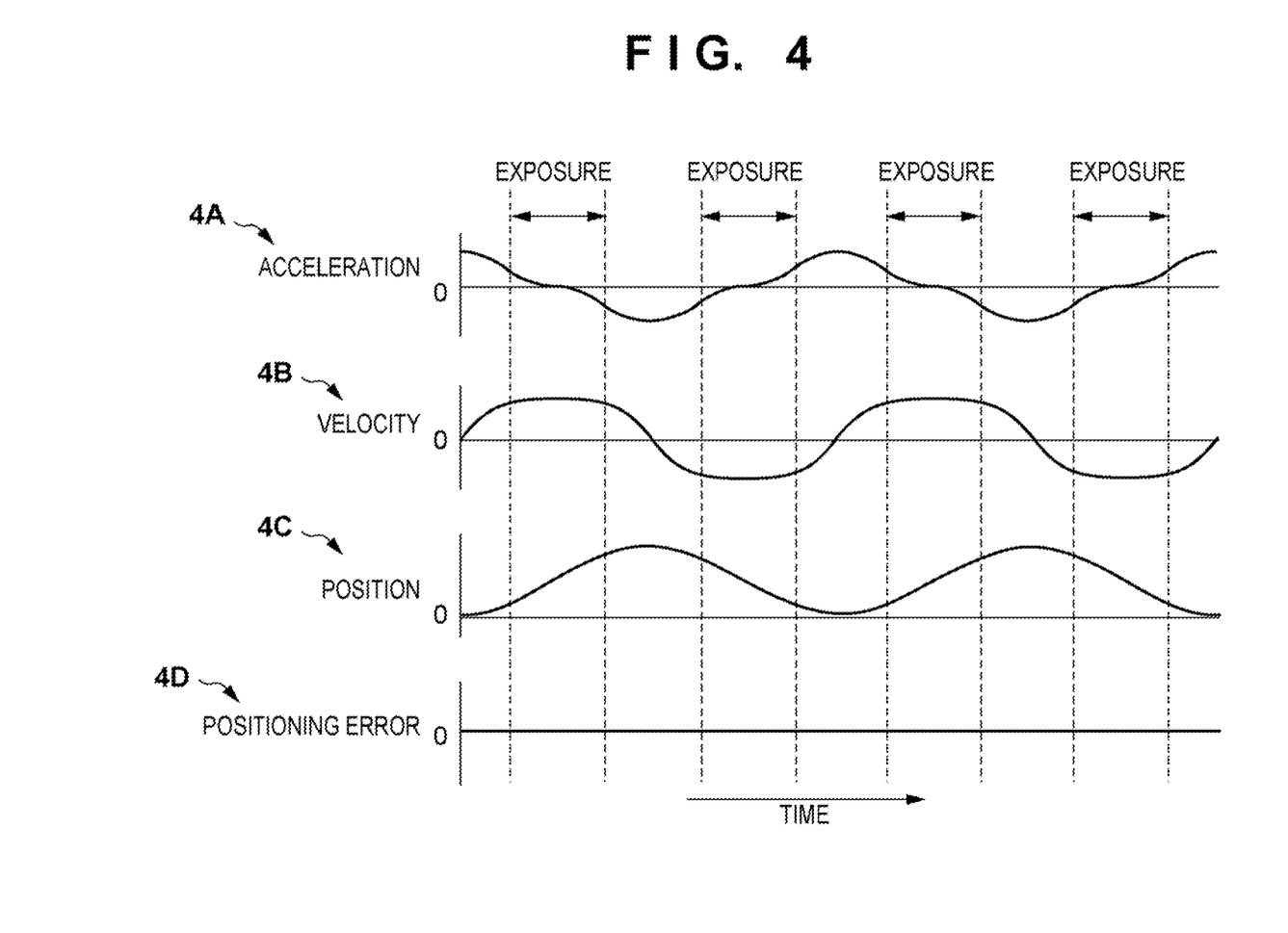
FIG. 4 is a graph showing the relationship between the exposure timing and the driving profile of a substrate stage according to the third embodiment.

Expression (2) shows an example in which an optimum value is determined with reference to the velocity profile, instead of using the amplitude derived from a Fourier series expression. $(1/k_1)$ in the amplitude part of expression (1) is changed to (1/10). FIG. 4 (the bottom graph in FIG. 4) shows the stage driving profile based on expression (2). The velocity profile during exposure has a shape closer to a straight line in 4B of FIG. 4 than in 1B of FIGS. 1 and 3B of FIG. 3. Also, the velocity change width during exposure is smaller in 4B of FIG. 4 than in 1B of FIGS. 1 and 3B of FIG. 3.

This means that when a stage driving profile is to be generated by combining a plurality of sine waves, the amplitudes and the frequencies of the sine waves can be freely set in accordance with the purpose of use of this profile as long as sine waves having frequencies lower than the resonance frequency in stage control are used.

Fourth Embodiment

An example which assumes a so-called non-immersion scanning exposure apparatus which mainly uses an excimer laser such as a KrF laser or an ArF laser as a light source has been shown in the first to third embodiments. However, the present invention is also applicable to an immersion exposure apparatus, and a unique effect when the present invention is applied to an immersion exposure apparatus is even expected to be produced. A unique effect when the present invention is applied to an immersion exposure apparatus will be described below.

In an immersion exposure apparatus, a liquid film (not shown) is formed between a projection optical system 7 and a substrate 8 in FIG. 2. Also, an auxiliary member (not shown) is provided at a position which is in the vicinity of the substrate 8 and at which it is nearly flush with the substrate 8. Thus, the liquid film is held between the projection optical system 7 and the substrate 8 even when the vicinity of the edge portion of the substrate 8 is exposed. Note that in exposing the edge portion of the substrate 8, a stage normally moves to the position at which the liquid film falls outside the substrate 8. This is because the stage has a run-up distance required to ensure a given stage acceleration/deceleration interval. Especially in the conventional driving profile, exposure is impossible until the stage velocity reaches a predetermined velocity, so a run-up distance required to accelerate/decelerate the stage is always necessary, and the distance by which the liquid film falls outside the substrate 8 is relatively large.

When the distance by which the liquid film falls outside the substrate 8 is calculated based on the conventional driving profile under given conditions, the liquid film may fall outside the substrate 8 by about 80 to 100 mm to expose a shot region 33 mm on a side in the scanning direction. Therefore, to hold the liquid film, a large auxiliary member must be designed in consideration of the distance by which the liquid film falls outside the substrate 8. However, with an increase in size of the auxiliary member, the size of the stage also increases. This makes it necessary to increase the size of the overall apparatus as well, so an increase in auxiliary member is desirably avoided as much as possible.

On the other hand, since the present invention is originally intended for a system which performs exposure during acceleration/deceleration, this system entails no run-up distance for the reason explained in the prior art description. After exposure of one shot region is completed, it takes time for the stage to move in a direction perpendicular to the scanning direction, and the stage moves by a distance equal to or larger than the shot length in the scanning direction upon elapse of this time. In other words, as the movement time shortens upon raising the maximum stage acceleration in a direction perpendicular to the scanning direction, the distance by which the stage moves in the scanning direction in an exposure operation can be reduced more. Since the distance by which the stage moves in the scanning direction and which is required for exposure can be reduced, the distance by which the liquid film falls outside the substrate 8 can also be reduced, thus keeping the size of the auxiliary member small. This means that when the present invention is applied to an immersion exposure apparatus, it is possible to reduce the stage run-up interval required for exposure, and, in turn, to reduce the size of the stage and, eventually, that of the overall apparatus.

Fifth Embodiment

When a configuration according to the present invention is applied to an electron beam (EB) exposure apparatus or a liquid-crystal exposure apparatus as well, an effect is expected to be produced. The EB exposure apparatus can perform exposure amount control by controlling the amount of electrons that reach the substrate 8. The EB exposure apparatus can maintain the dose constant by controlling the amount of electrons in accordance with the stage velocity while performing drawing using an electron beam. In the EB exposure apparatus as well, when exposure is performed during acceleration/deceleration, it is desirable that the stage velocity change rate is low, the stage velocity error is nearly zero, and the stage positioning error is small. Hence, by performing exposure to an electron beam using the driving profile described in one of the first to third embodiments, exposure can be performed during acceleration/deceleration while suppressing degradation in exposure amount control performance and pattern overlay accuracy.

A liquid-crystal exposure apparatus has basically the same configuration as a semiconductor exposure apparatus except that in the former the substrate 8 uses a glass substrate in place of a wafer. Hence, the same effect is expected to be produced by performing exposure using a driving profile similar to that according to one of the first to third embodiments.

[Method of Manufacturing Device]

A method of manufacturing a device (for example, a semiconductor device or a liquid crystal display device) will be described next. A semiconductor device is manufactured by a preprocess of forming an integrated circuit on a wafer, and a post-process of completing, as a product, a chip of the integrated circuit formed on the wafer by the preprocess. The preprocess includes a step of exposing a wafer, coated with a photosensitive agent, using the above-mentioned exposure apparatus, and a step of developing the wafer. The post-process includes an assembly step (dicing and bonding) and packaging step (encapsulation). A liquid crystal display device is manufactured by a step of forming a transparent electrode. The step of forming a transparent electrode includes a step of coating a photosensitive agent on a glass substrate on which a transparent conductive film is deposited, a step of exposing the glass substrate, coated with the photosensitive agent, using the above-mentioned exposure apparatus, and a step of developing the glass substrate. The method of manufacturing a device according to this embodiment can manufacture a device with a quality higher than that of a device manufactured by the prior art technique.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2011-000005 filed Jan. 1, 2011, which is hereby incorporated by reference herein in its entirety.

What is claimed is:

1. A scanning exposure apparatus which exposes a plurality of shot regions on a substrate to light while scanning an original and the substrate, the apparatus comprising:
   a stage which holds the substrate and moves; and
   a controller which controls movement of said stage based on a driving profile that defines the movement of said stage,
   wherein a portion in the driving profile, which defines the movement of said stage during exposure of at least one shot region, is formed by a sine wave having a frequency lower than a resonance frequency in a stage controller.

2. The apparatus according to claim 1, further comprising a light source which emits light to expose the substrate,
   wherein said controller controls said light source based on the driving profile so that the substrate is irradiated with the light at a light amount corresponding to a velocity of said stage during exposure of each shot region.

3. The apparatus according to claim 2, wherein said controller obtains an acceleration profile of said stage, which is formed by the sine wave having the frequency lower than the resonance frequency, to generate a velocity profile and a position profile of said stage from the obtained acceleration profile, thereby controlling the movement of said stage based on the generated position profile, and controlling said light source based on the generated velocity profile.

4. The apparatus according to claim 1, wherein the driving profile is formed by a sine wave having a frequency lower than a half of the resonance frequency.

5. The apparatus according to claim 1, wherein the driving profile is formed by combining a sine wave having a first frequency, and a sine wave having a frequency three times the first frequency and an amplitude one third of the first frequency.

6. The apparatus according to claim 1, wherein said controller controls the movement of said stage based on the driving profile in at least one reciprocating scanning operation of said stage.

7. A scanning exposure apparatus which exposes a plurality of shot regions on a substrate to light while scanning an original and the substrate, the apparatus comprising:
   a stage which holds the substrate and moves; and
   a controller which controls movement of said stage based on a driving profile that defines the movement of said stage,
   wherein a portion in the driving profile, which defines the movement of said stage during exposure of at least one shot region, is formed by combining not more than three sine waves having a frequency lower than a resonance frequency in a stage controller.

8. The apparatus according to claim 1, wherein the scanning exposure apparatus includes an immersion exposure apparatus.

9. The apparatus according to claim 7, wherein the scanning exposure apparatus includes an immersion exposure apparatus.

10. A method of manufacturing a device, the method comprising:
    exposing a substrate to light using a scanning exposure apparatus which exposes a plurality of shot regions on the substrate to light while scanning an original and the substrate;
    developing the exposed substrate; and
    processing the developed substrate to manufacture a device,
    the scanning exposure apparatus including:
    a stage which holds the substrate and moves; and
    a controller which controls movement of the stage based on a driving profile that defines the movement of the stage,
    wherein a portion in the driving profile, which defines the movement of the stage during exposure of at least one shot region, is formed by a sine wave having a frequency lower than a resonance frequency in a stage controller.

11. A method of manufacturing a device, the method comprising:
    exposing a substrate to light using a scanning exposure apparatus which exposes a plurality of shot regions on the substrate to light while scanning an original and the substrate;
    developing the exposed substrate; and
    processing the developed substrate to manufacture a device,
    the scanning exposure apparatus including:
    a stage which holds the substrate and moves; and
    a controller which controls movement of said stage based on a driving profile that defines the movement of said stage,
    wherein a portion in the driving profile, which defines the movement of said stage during exposure of at least one shot region, is formed by combining not more than three sine waves having a frequency lower than a resonance frequency in a stage controller.

* * * * *